United States Patent
Brunner et al.

(10) Patent No.: US 8,227,180 B2
(45) Date of Patent: Jul. 24, 2012

(54) PHOTOLITHOGRAPHY FOCUS IMPROVEMENT BY REDUCTION OF AUTOFOCUS RADIATION TRANSMISSION INTO SUBSTRATE

(75) Inventors: Timothy Allan Brunner, Ridgefield, CT (US); Sean David Burns, Hopewell Junction, NY (US); Kuang-Jung Chen, Poughkeepsie, NY (US); Wu-Song Huang, Brewster, NY (US); Kafai Lai, Poughkeepsie, NY (US); Wai-Kin Li, Beacon, NY (US); Bernhard R. Liegl, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/158,901

(22) Filed: Jun. 13, 2011

(65) Prior Publication Data

US 2011/0256486 A1 Oct. 20, 2011

Related U.S. Application Data

(62) Division of application No. 12/033,303, filed on Feb. 19, 2008, now abandoned.

(51) Int. Cl.
*G03F 7/00* (2006.01)
*G03F 7/028* (2006.01)
*G03F 7/11* (2006.01)
*G03F 7/20* (2006.01)
*G03F 7/40* (2006.01)

(52) U.S. Cl. .................. 430/322; 430/270.1; 430/311; 430/317; 430/331; 430/926; 430/396

(58) Field of Classification Search .............. 430/270.1, 430/271.1, 311, 317, 322, 331, 396, 926
See application file for complete search history.

(56) References Cited

U.S. PATENT DOCUMENTS

| 4,568,140 A | 2/1986 | van der Werf et al. |
| 4,575,399 A | 3/1986 | Tanaka et al. |
| 4,681,430 A | 7/1987 | Goel et al. |
| 5,059,808 A | 10/1991 | Tarui et al. |
| 5,294,680 A | 3/1994 | Knors et al. |

(Continued)

FOREIGN PATENT DOCUMENTS

JP 11077909 A 3/1999

OTHER PUBLICATIONS

H. W. Sands Corporation, Jupiter, FL 33477, as product No. SDA4137, www.hwsands.com, pp. 1-12.

(Continued)

*Primary Examiner* — Amanda C. Walke
(74) *Attorney, Agent, or Firm* — Scully, Scott, Murphy & Presser, P.C.; Wenjie Li

(57) ABSTRACT

An anti-reflective coating material, a microelectronic structure that includes an anti-reflective coating layer formed from the anti-reflective coating material and a related method for exposing a resist layer located over a substrate while using the anti-reflective coating layer provide for attenuation of secondary reflected vertical alignment beam radiation when aligning the substrate including the resist layer located thereover. Such enhanced vertical alignment provides for improved dimensional integrity of a patterned resist layer formed from the resist layer, as well as additional target layers that may be fabricated while using the resist layer as a mask.

9 Claims, 8 Drawing Sheets

U.S. PATENT DOCUMENTS

| | | |
|---|---|---|
| 5,723,617 A | 3/1998 | Cuny |
| 5,919,853 A | 7/1999 | Condit et al. |
| 5,945,209 A | 8/1999 | Okazaki et al. |
| 6,069,244 A | 5/2000 | Masuda et al. |
| 6,136,719 A | 10/2000 | Miller et al. |
| 6,579,662 B1 | 6/2003 | Zheng et al. |
| 6,689,518 B1 | 2/2004 | Williams et al. |
| 6,861,201 B2 | 3/2005 | Weed et al. |
| 7,049,052 B2 * | 5/2006 | Xiao et al. .................. 430/323 |
| 7,175,949 B1 | 2/2007 | Tao et al. |
| 2001/0005278 A1 | 6/2001 | Onomichi et al. |
| 2006/0057501 A1 | 3/2006 | Wu et al. |
| 2006/0138410 A1 * | 6/2006 | Lalbahadoersing et al. .... 257/48 |
| 2007/0015082 A1 | 1/2007 | Angelopoulos et al. |

OTHER PUBLICATIONS

AN 1987:587126. CAPLUS file on ACS on STN, abstract of Yao, article Proceedingso fSPIEj(1987, vol. 772, pp. 118-123.

English translation of JP, 11-077909, A (1999) from machine translation from AIPN Japan Patent Office National Center for Industrial Property Information and Training, generated Dec. 21, 2009, 15 pages.

* cited by examiner

PHOTOLITHOGRAPHY FOCUS IMPROVEMENT BY REDUCTION OF AUTOFOCUS RADIATION TRANSMISSION INTO SUBSTRATE

CROSS REFERENCE TO RELATED APPLICATION

This application is a divisional of U.S. patent application Ser. No. 12/033,303, filed Feb. 19, 2008 the entire content and disclosure of which is incorporated herein by reference.

BACKGROUND

1. Field of the Invention

The invention relates generally to photolithographic methods within microelectronic fabrication. More particularly, the invention relates to enhanced performance photolithographic methods within microelectronic fabrication.

2. Description of the Related Art

The process of fabricating a semiconductor structure within a semiconductor substrate, or another type of microelectronic structure within another type of microelectronic substrate, typically includes the use of a resist layer, that is selectively exposed and subsequently developed while using an exposure apparatus and then a development apparatus, to form a patterned resist layer that is used as a mask layer for selectively forming a particular semiconductor structure or a particular microelectronic structure within and upon the semiconductor substrate or the microelectronic substrate.

While the use of resist layers and exposure apparatus is thus quite common within the semiconductor and microelectronic fabrication art, the use of resist layers and exposure apparatus is nonetheless not entirely without problems within the semiconductor and microelectronic fabrication art. In particular, a proper exposure of a substrate having a resist layer located thereover within an exposure apparatus may often be compromised by spurious light effects. In addition, such compromised exposure in turn may lead to unacceptable resist features, such as improperly sized contact holes, that are formed from such compromised exposure of a blanket resist layer.

Various microelectronic structures, and related structures such as lithographic structures, for which optical considerations are relevant, are known in the microelectronic fabrication and generally related arts.

For example, van der Werf et al., in U.S. Pat. No. 4,568,140, teaches an optical component that may be used in an optical fiber telecommunications system, where the optical component includes an anti-reflective coating effective in the infrared region. The anti-reflective coating includes a number of stacked uniform layers having appropriately graduated indexes of refraction.

In addition, Miller et al., in U.S. Pat. No. 6,136,719, teaches a method for etching a portion of a thickness of a resist layer from over a substrate that is employed for fabricating a semiconductor structure. The method uses an infrared absorbing material that is incorporated within the resist layer, where an infrared absorption intensity of the infrared absorbing material provides a measurement of a thickness of the resist layer when etching the resist layer.

Further, Zheng et al., in U.S. Pat. No. 6,579,662, teaches an imaging member, such as a negative working printing plate, that may be thermally imaged absent conventional alkaline processing. To achieve the foregoing result, the imaging member uses an infrared absorbing dye.

Still further, Williams et al., in U.S. Pat. No. 6,689,518 teaches an imaging element, such as a photographic display imaging element, that may incorporate an invisible marking. Such an invisible marking may be effected using an infrared absorbing dye.

Still yet further, Weed et al., in U.S. Pat. No. 6,861,201, teaches particular photopolymer compositions that are optically sensitive in the infrared region. The particular photopolymer compositions include an infrared absorbing dye that is compatible with a hexaarylbiimidazole (HABI) photoinitiator.

Finally, Tao et al., in U.S. Pat. No. 7,175,949, teaches a negative working radiation sensitive composition that may be used within an imaging element. The negative working radiation sensitive composition includes a polymer backbone that incorporates a carbazole derivative.

Lithographic methods, lithographic materials and lithographic apparatus are certain to remain useful as semiconductor and microelectronic fabrication technology advances. To that end, desirable are lithographic methods, lithographic materials and lithographic apparatus that have enhanced performance.

SUMMARY

The invention includes: (1) an anti-reflective coating material; (2) a microelectronic structure that includes an anti-reflective coating layer that comprises the anti-reflective coating material; and (3) a method for exposing a resist layer within the microelectronic structure that includes the anti-reflective coating layer that comprises the anti-reflective coating material. The anti-reflective coating material has a first absorption peak (i.e., having a first absorbance greater than about 0.4) corresponding with an exposure apparatus vertical alignment beam wavelength (i.e., greater than about 800 nanometers and typically from about 900 to about 1200 nanometers). The anti-reflective coating material may also have a second absorption peak (i.e., having a second absorbance from about 0.1 to about 0.7) corresponding with an exposure beam wavelength (i.e., less than about 300 nanometers and typically 193 nanometers). Finally, the anti-reflective coating material typically also has no additional absorption peak interposed between the first absorption peak and the second absorption park (i.e., an absorbance less than about 0.1 interposed between the first absorption peak and the second absorption peak).

The microelectronic structure and the method for exposing the resist layer while using the anti-reflective coating composition generally provides that the anti-reflective coating composition is located (i.e., in the form of an anti-reflective coating layer) interposed between a target layer and a resist layer located and successively layered and formed over a substrate. However, the invention also contemplates a microelectronic structure and related method that includes the resist layer located interposed between the target layer and an anti-reflective coating layer comprised of the anti-reflective coating material, where the anti-reflective coating layer is furthest from the substrate. The substrate including the resist layer is vertically aligned (for focusing purposes) and horizontally aligned (for registration purposes) prior to exposing the resist layer while using a resist exposure beam. The presence of the anti-reflective coating layer, whether located interposed between the target layer and the resist layer or whether located above the resist layer which may in-turn be located above the target layer and finally the substrate, attenuates reflections from a reflective layer that also underlies the resist layer when vertically aligning the substrate having the resist layer thereover prior to exposing the resist layer.

The invention is predicated upon the observation that absent an anti-reflective coating layer in accordance with the invention, a vertical alignment of a substrate having a resist layer located there over may not be accurate since a vertical alignment beam (i.e., that is also intended as an auto focus alignment beam that typically has a wavelength in the near infrared) which is typically a small angle reflected alignment beam, may be influenced by reflections from the underlying reflective layer.

A particular anti-reflective coating material in accordance with the invention includes a composition of matter that exhibits a first absorption peak in a wavelength range greater than about 800 nanometers. The first absorption peak corresponds with an exposure apparatus vertical alignment beam wavelength.

A particular microelectronic structure in accordance with the invention includes a substrate, as well as a resist layer located over the substrate. This particular microelectronic structure also includes an anti-reflective coating layer also located over the substrate. The anti-reflective coating layer includes a composition of matter that exhibits a first absorption peak at an exposure apparatus vertical alignment beam wavelength.

A particular method for exposing a resist layer includes forming, layered over a substrate, a target layer, an anti-reflective coating layer located over the target layer and a resist layer also located over the target layer, to form a layered substrate. The anti-reflective coating layer includes a composition of matter that exhibits a first absorption peak at an exposure apparatus vertical alignment beam wavelength. The method also includes vertically aligning the layered substrate within an exposure apparatus while using an exposure apparatus vertical alignment beam and horizontally aligning the layered structure within the exposure apparatus while using an exposure apparatus horizontal alignment beam to yield an aligned layered substrate. The method also includes exposing the resist layer within the aligned layered substrate within the exposure apparatus while using an exposure beam.

Another particular method for exposing a resist layer in accordance with the invention includes positioning within an exposure apparatus a microelectronic structure that includes a reflective layer located over a substrate and a resist layer located over the reflective layer. The method also includes vertically aligning the microelectronic structure within the exposure apparatus while attenuating a reflection of a vertical alignment beam from the reflective layer, to provide an aligned substrate. The method also includes exposing the aligned substrate within the exposure apparatus.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, that form a material part of this disclosure, wherein.

DESCRIPTION OF THE PREFERRED EMBODIMENT

The invention, which includes an anti-reflective coating material, a microelectronic structure that includes an anti-reflective coating layer comprising the anti-reflective coating material and a method for exposing a resist layer and forming a patterned layer within the microelectronic structure that includes the anti-reflective coating layer that comprises the anti-reflective coating material, is understood within the context of the description set forth below. The description set forth below is understood within the context of the drawings described above. Since the drawings are intended for illustrative purposes, the drawings are not necessarily drawn to scale.

Figure 1:
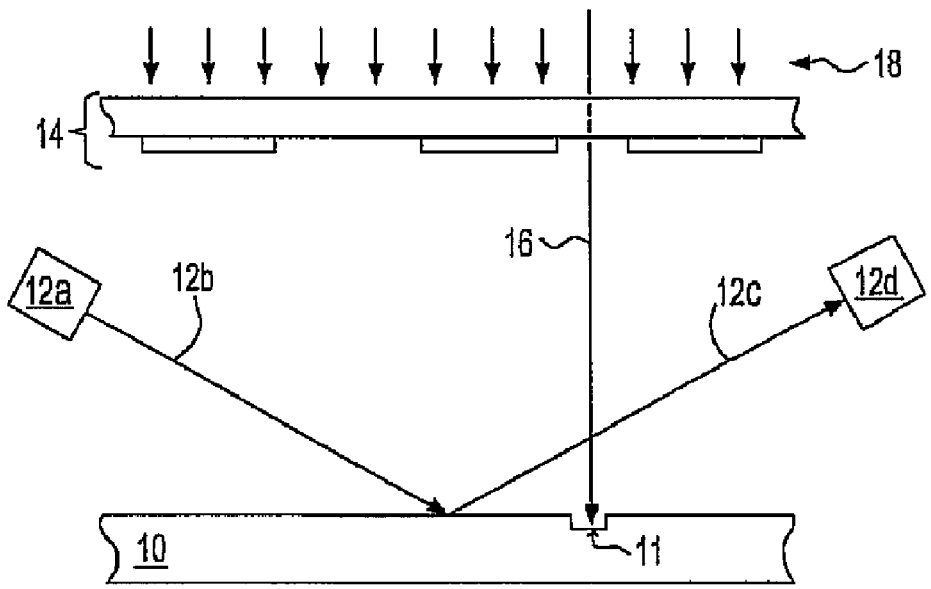
FIG. 1 shows a schematic diagram of a microelectronic substrate juxtaposed a reticle within an exposure apparatus generally in accordance with the microelectronic fabrication art.

FIG. 1 shows a schematic diagram of an exposure apparatus (i.e., a photoexposure apparatus such as a photolithographic exposure apparatus) illustrating the relative positioning of a vertical alignment beam, a horizontal alignment beam and an exposure beam with respect to a reticle and a substrate.

Specifically, FIG. 1 shows a substrate 10 that includes therein an alignment mark 11 located within the substrate 10. FIG. 1 also shows a reticle 14 located juxtaposed the substrate 10 that includes the alignment mark 11. As is understood by a person skilled in the art, it is desirable to position the substrate 10 at a proper distance both vertically (i.e., for focusing purposes) and horizontally (i.e., for registration purposes) with respect to the reticle 14 so that a properly focused and registered image is latently formed within a resist layer (i.e., not shown) that is located and formed upon or over the substrate 10.

To provide for such a proper vertical positioning of the substrate 10 within the exposure apparatus of FIG. 1, the particular exposure apparatus whose schematic diagram is illustrated in FIG. 1 uses an incident vertical alignment beam 12b that emanates from a vertical alignment beam source 12a. Absent a resist layer located over the substrate 10, the incident vertical alignment beam 12b impinges upon the substrate 10 and is reflected from the substrate 10 as a reflected vertical alignment beam 12c that is received by a vertical alignment beam detector 12d. Such an incident vertical alignment beam 12b and reflected vertical alignment beam 12c may also conventionally be known as an incident auto-focus beam and a reflected auto-focus beam.

In order to provide for such a proper horizontal positioning of at least the reticle 14 with respect to the substrate 10 within the exposure apparatus whose schematic diagram is illustrated in FIG. 1, the particular exposure apparatus whose schematic diagram is illustrated in FIG. 1 uses a horizontal alignment beam 16 that passes through a designated transparent portion of the reticle 14 and aligns with respect to the alignment mark 11 that is located within the substrate 10. At least one of the reticle 14 and the substrate 10 is positioned horizontally with respect to the other of the reticle 14 and the substrate 10 so that the horizontal alignment beam 16 is optimally positioned with respect to the desired transparent portion of the reticle 14 and the alignment mark 11.

Subsequent to aligning at least the reticle 14 (and possibly also other related exposure beam optical components) vertically and horizontally with respect to the substrate 10, an exposure beam 18 is made to impinge upon the reticle 14 is a fashion to selectively expose portions of a resist layer (which again is not shown) otherwise located over the substrate 10.

Figure 2:
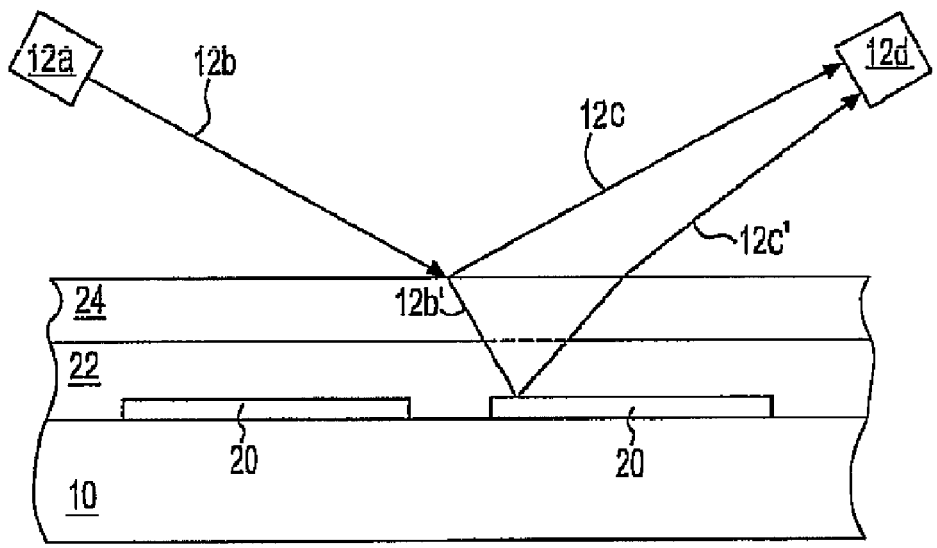
FIG. 2 shows a schematic diagram illustrating the results of vertically aligning the microelectronic substrate including overlying layers and a resist layer located thereover while using selected components within the exposure apparatus whose schematic diagram is illustrated in FIG. 1.

FIG. 2 shows in greater detail the results of vertically aligning the substrate 10 that is illustrated in FIG. 1 within the exposure apparatus that is illustrated in FIG. 1, but wherein the substrate 10 now has additional layers located thereupon and/or thereover. As is illustrated within the schematic diagram of FIG. 2, the additional layers located upon or over the substrate 10 are intended in-part as a reflective layer 20 located upon the substrate 10. Also included is a transparent layer 22 located upon exposed portions of the substrate 10 and the reflective layer 20. Finally, also included is a resist layer 24 located upon the transparent layer 22. The substrate 10 may also have additional layers of other material types located and formed thereover, although this particular embodiment illustrates the reflective layer 20 and the transparent layer 22.

As is intended within the schematic diagram of FIG. 2, and as will be described in greater detail below, the resist layer 24 and the transparent layer 22 may comprise resist materials and transparent materials that are both otherwise generally transparent to a wavelength of light that comprises the incident vertical alignment beam 12b. Thus, as is further illustrated within the schematic cross-sectional diagram of FIG. 2, at an appropriate angle of incidence with respect to the surface of the resist layer 24, the incident vertical alignment beam 12b splits at the surface of the resist layer 24 to a reflected vertical alignment beam 12c and a secondary incident vertical alignment beam 12b'. This particular secondary incident vertical alignment beam 12b' is in turn reflected from the reflective layer 20 underlying the resist layer 24 to provide a secondary reflected vertical alignment beam 12c'.

As is further illustrated within the schematic diagram of FIG. 2, the reflected vertical alignment beam 12c and the secondary reflected vertical alignment beam 12c' both may potentially converge at the vertical alignment beam detector 12d. As a result of this possible convergence, a vertical alignment error may be introduced into a photoexposure apparatus as is generally illustrated in FIG. 1, so that the resist layer 24 that is located over the substrate 10 is not located in an optimal focal plane for exposing the resist layer 24. As a further result of such a vertical alignment error, the resist layer 24 may be improperly exposed and thus eventually provide a patterned resist layer of dimensional constraints and integrity other than originally intended. Such a patterned resist layer of dimensional constraints and integrity other than originally intended is undesirable since the dimensional constraints and integrity other than originally intended in turn provide for microelectronic layers and structures of dimensional constraints and integrity other than originally intended.

In order to address the foregoing vertical misalignment of the microelectronic substrate 10 including in particular the resist layer 24 that is illustrated in FIG. 2 within an exposure apparatus as is illustrated in FIG. 1 and in-part within FIG. 2, the invention provides in general for use of a particular type of anti-reflective coating layer (i.e., comprising a particular type of anti-reflective coating material). In a particular embodiment that follows, the particular anti-reflective coating layer is illustrated as interposed between the resist layer 24 and the substrate 10, and also between the resist layer 24 and the reflective layer 20. In another particular embodiment that follows, the particular anti-reflective coating layer is illustrated as located above the resist layer 24 that in-turn is located above the substrate 10 and the reflective layer 20. In a broad embodiment, such an anti-reflective coating layer comprises an anti-reflective coating material that attenuates reflection via absorption (with an extinction coefficient greater than about 0.4) at a vertical alignment beam wavelength (which will typically be in a near infrared wavelength region greater than about 800 nanometers and preferably from about 900 to about 1200 nanometers). In a less broad, but nonetheless desirable operative embodiment such an anti-reflective coating layer comprises an anti-reflective coating material that attenuates reflection via absorption (with a extinction coefficient greater than about 0.4) at a vertical alignment beam wavelength (which will typically be in a near infrared wavelength region greater than about 800 nanometers and preferably from about 800 to about 1200 nanometers) and attenuates reflection via absorption (with an extinction coefficient from about 0.1 to about 0.7) at an exposure radiation wavelength (which will typically be less than 300 nanometers and more preferably from about 150 to about 300 nanometers and most preferably 193 nanometers), while transmitting (absent an absorption peak, and with an extinction coefficient less than about 0.1) at a horizontal alignment beam wavelength (which will typically be in a visible range from about 400 to about 700 nanometers).

Figure 3:
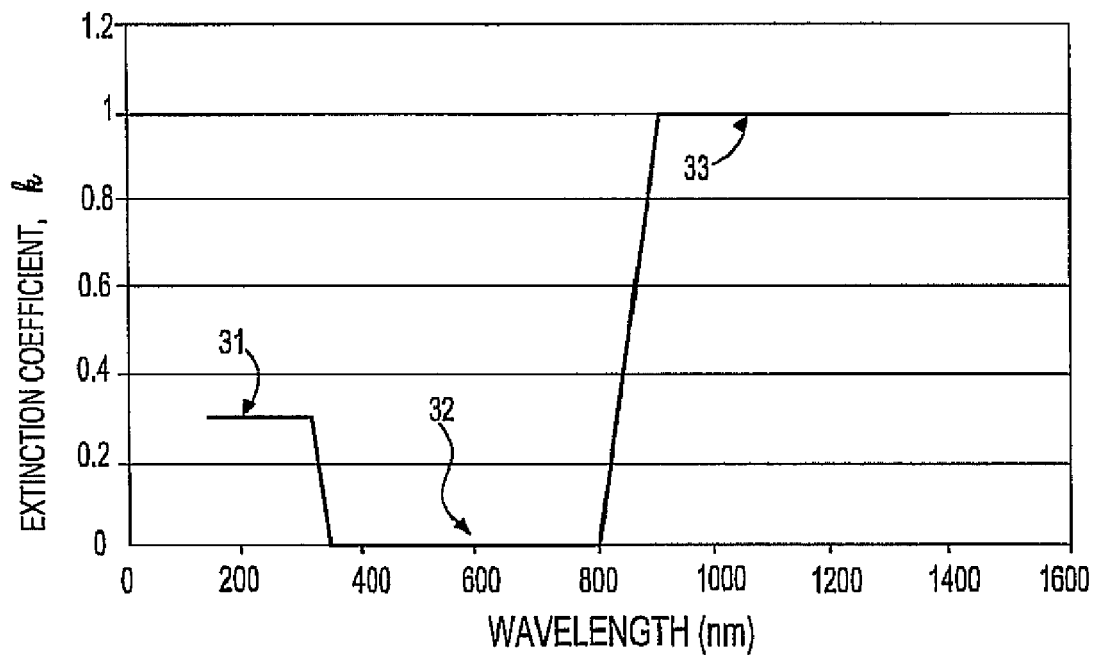
FIG. 3 shows an ideal absorption spectrum of an anti-reflective coating material and an anti-reflective coating layer in accordance with the invention.

FIG. 3 shows a general spectrum of a typical anti-reflective coating material or a typical anti-reflective coating layer in accordance with the foregoing optical absorption characteristics. As is illustrated in FIG. 3, such an anti-reflective coating material or an anti-reflective coating layer is illustrated as possessing: (1) at reference numeral 31 an extinction coefficient (k) of about 0.1 to about 0.7 (i.e., more particularly about 0.3) at an exposure wavelength of 193 nanometers; (2) at reference numeral 32 an extinction coefficient of zero at a horizontal alignment beam wavelength, such as 630 nanometers, and/or an overlay measurement beam wavelength, such as 500 nanometers; and (3) at reference numeral 33 an extinction coefficient of greater than about 0.4 (i.e., more particularly about 1.0) at a vertical alignment beam wavelength, such as 1000 nanometers.

Desirably, when located above a resist layer which in-turn is located above a reflective layer and a substrate, an anti-reflective material or an anti-reflective coating in accordance with such a particular embodiment may alternatively possess, as also correlating with FIG. 3: (1) at reference numeral 31 an extinction coefficient of about 0 at an exposure wavelength of 193 nanometers; (2) at reference numeral 32 an extinction coefficient of zero at a horizontal alignment beam wavelength, such as 630 nanometers, and/or an overlay measurement beam wavelength, such as 500 nanometers; and (3) at reference numeral 33 an extinction coefficient greater than about 0.4 at a vertical alignment beam wavelength, such as 1000 nanometers.

Figure 4:
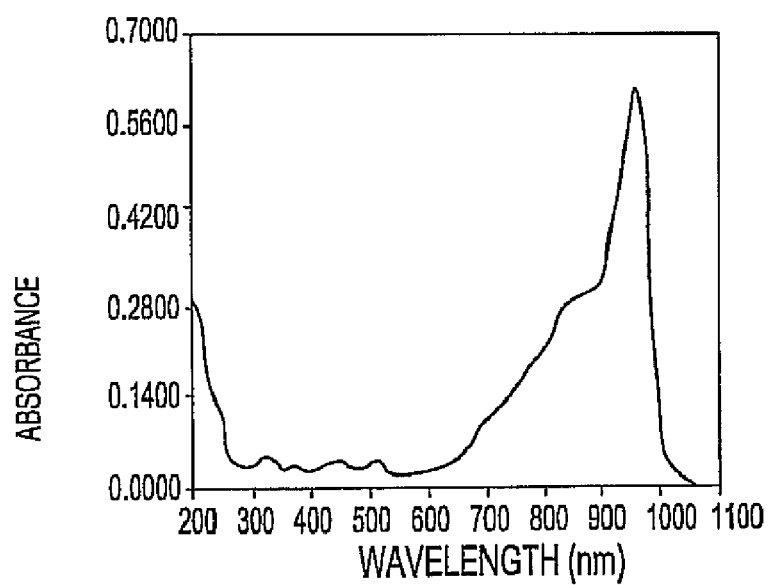
FIG. 4 shows an absorption spectrum of a commercially available near infrared absorbing dye.

FIG. 4 shows a spectrum of a commercially available dye that fulfills the optical properties that are illustrated within the absorption spectrum of FIG. 3. This particular commercially available dye is available from H. W. Sands Corporation, Jupiter, Fla. 33477, as product number SDA4137. Other commercially available infrared absorbing dyes are also readily available.

For example, additional examples of infrared absorptive dyes that may be used within the context of the invention are taught within Cuny, in U.S. Pat. No. 5,723,617. Cuny, the teachings of which are incorporated herein fully by reference, teaches isoquinoline dyes that absorb in the near infrared in a wavelength range from about 700 to about 1400 nm, absent an absorption peak in the 300 to 400 nanometer region.

Either the dye whose spectrum is illustrated in FIG. 4, or the additional dyes that are taught within Cuny, or alternatively any of several other commercially available dyes, may be used in conjunction with an otherwise appropriately transparent base polymer material, to form an anti-reflective coating material (i.e., a composition of matter). A desired thickness of an anti-reflective coating layer formed from the anti-reflective coating material will generally guide a loading of a dye within the otherwise appropriately transparent base polymer material. Thus, operative compositions of matter for an anti-reflective coating material in accordance with the invention may be readily determined absent undue experimentation.

FIG. 5 to FIG. 11 show a series of schematic diagrams illustrating the results of successive stages in aligning a substrate having a resist layer located thereover and exposing the resist layer located over the substrate while using an anti-reflective coating layer comprising an anti-reflective coating material in accordance with a particular embodiment of the invention. This particular embodiment of the invention comprises a first embodiment of the invention.

Figure 5:
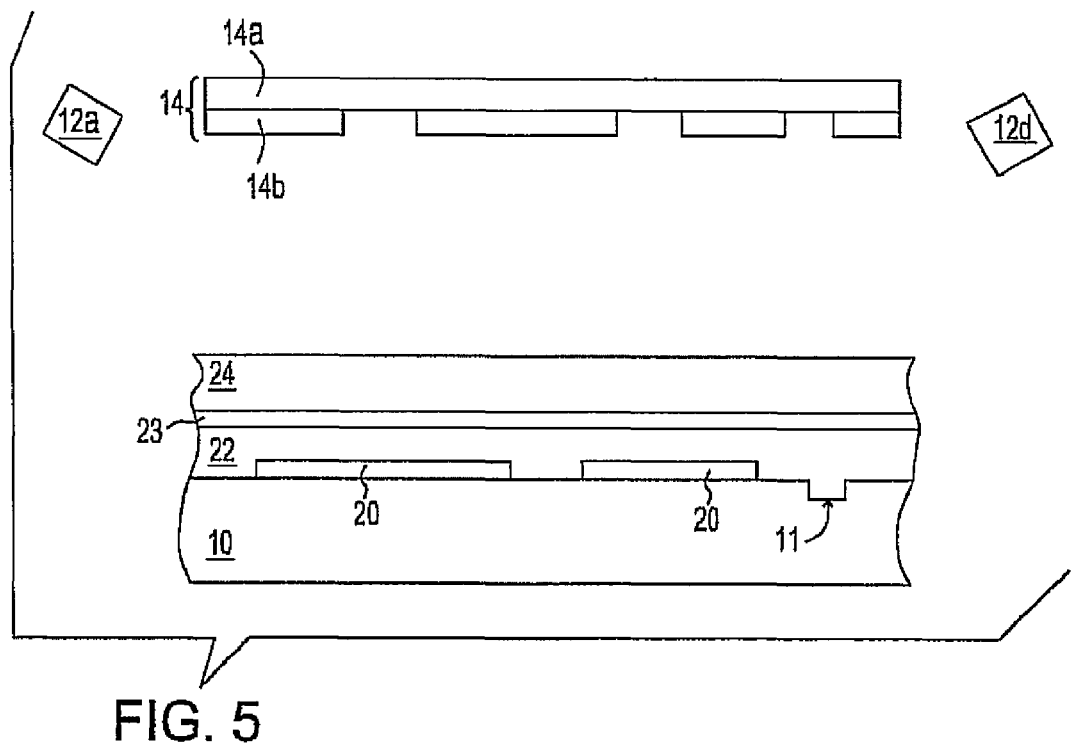
FIG. 5 to FIG. 11 show a series of schematic cross-sectional diagrams illustrating the results of progressive stages in forming a patterned layer within a microelectronic structure while using an anti-reflective coating layer to enhance focus when exposing a resist layer used for forming the patterned layer in accordance with a particular embodiment of the invention.

FIG. 5 first shows the substrate 10. The reflective layer 20 is located upon the substrate 10. The transparent layer 22 is located upon exposed portions of the reflective layer 20 and the substrate 10. An anti-reflective coating layer 23 in accordance with the invention is located upon the transparent layer 22. The resist layer 24 is located upon the anti-reflective coating layer 23.

The substrate 10 may comprise any of several microelectronic materials. Non-limiting examples include conductor materials, semiconductor materials and dielectric materials. Commonly, the substrate 10 may comprise a ceramic substrate material. More commonly, the substrate 10 may comprise a semiconductor substrate material. Non-limiting examples of semiconductor substrate materials include silicon, germanium, silicon-germanium alloy, silicon-carbon alloy, silicon-germanium-carbon alloy and compound semiconductor materials. Non-limiting examples of compound semiconductor materials include gallium arsenide, indium arsenide and indium phosphide semiconductor materials.

When the substrate 10 in particular comprises a semiconductor substrate material, the substrate 10 may include microelectronic devices, such as in particular semiconductor devices, located and formed therein and/or thereupon, that are otherwise generally conventional in the semiconductor fabrication art. Such semiconductor devices may include, but are not necessarily limited to, resistors, transistors, diodes and capacitors.

The alignment mark 11 within the substrate 10 may comprise any of several geometric shapes that are either recessed within the substrate 10 or layered upon the substrate 10. Circles, squares, regular and irregular polyhedra as geometric shapes may each be used within the context of the alignment mark 11, absent limitation to the embodiment or the invention.

The reflective layer 20 may comprise any of several reflective materials that are reflective with respect to a wavelength of light that is used within an exposure apparatus vertical alignment beam 12b that is illustrated in FIG. 1 and FIG. 2. Such reflective materials may include, but are not necessarily limited to, reflective conductor materials, reflective semiconductor materials and reflective dielectric materials. Reflective conductor materials are particularly common, and to that end such reflective conductor materials may include, but are not necessarily limited to metals, metal alloys, metal nitrides and metal silicides that are otherwise generally conventional in the microelectronic fabrication art. Particularly common are copper and copper alloy conductor materials that are appropriately reflective. Such reflective materials may be formed using methods including but not limited to plating methods, chemical vapor deposition methods and physical vapor deposition methods that provide the reflective layer 20 of a generally conventional thickness.

The transparent layer 22 may comprise any of several materials that are transparent with respect to the wavelength of the photoexposure apparatus incident vertical alignment beam 12b that is illustrated in FIG. 1 and FIG. 2. Such transparent materials may include, but are not necessarily limited to, oxides, nitrides and oxynitrides of silicon, although oxides, nitrides and oxynitrides of other elements are not excluded. Such transparent materials may also be formed using methods that are generally conventional in the microelectronic fabrication art. Non-limiting examples include chemical vapor deposition methods and physical vapor deposition methods that provide the transparent layer 22 of a generally conventional thickness.

As is understood by a person skilled in the art, the transparent layer 22 is intended as a target layer within the context of the instant embodiment and the invention. While the instant embodiment illustrates such a target layer as generally comprising a transparent dielectric material, within the embodiments in particular or the invention in general, a target layer may comprise transparent, semi-transparent or opaque materials that may comprise, but are not necessarily limited to conductor materials, semiconductor materials or dielectric materials.

The anti-reflective coating layer 23 comprises an anti-reflective material having optical absorption properties within the context of specific wavelength regions that are described above. Such an anti-reflective coating layer 23 may comprise a single layer or an aggregate of layers that provide the above described absorption properties in the corresponding wavelength regions that are described above.

For example, the dye whose optical spectrum is illustrated in FIG. 4 may, due to the bimodal absorption characteristics of that dye, be employed by itself, in conjunction with an otherwise transparent carrier and binder, to form an anti-reflective coating material (i.e., a composition of material) or an anti-reflective coating layer. Alternatively, a first layer of a bilayer or multi-layer anti-reflective coating layer may comprise an absorptive material with absorbance characteristics in the 800 to 1200 nanometer range while a second layer of a bilayer anti-reflective coating layer may comprise an absorptive material with absorbance characteristics in the less than 300 nanometer range.

Similarly, while the above disclosure is directed towards an anti-reflective coating layer that comprises an infrared absorptive dye, which is typically an organic material, neither the embodiment nor the invention is intended to be so limited. Rather, the embodiment and the invention also contemplate that particular anti-reflective coating layers in accordance with the invention may comprise purely organic materials, purely inorganic materials or composites of inorganic materials and organic materials.

The resist layer 24 may comprise any of several resist materials formed to thicknesses that are otherwise generally conventional in the microelectronic fabrication art. Under certain circumstances, the resist material may also contain an infrared absorptive material such as an infrared absorptive dye. Thus, under those circumstances, the anti-reflective coating layer 22 and the resist layer 24 may be merged into a single layer. Non-limiting examples include positive resist materials, negative resist materials and hybrid resist materials that possess properties of positive resist materials and negative resist materials. For illustrative purposes within the context of further aligning, exposing and developing of the substrate 10 and/or the resist layer 24 located thereover in accordance with the instant embodiment, the resist layer 24 as illustrated will implicitly be intended as comprising a positive resist material, although neither the embodiment nor the invention is intended to be so limited.

FIG. 5 also illustrates the vertical alignment beam source 12a and the vertical alignment beam detector 12d that are illustrated in FIG. 1 and FIG. 2. Both the vertical alignment beam source 12a and the vertical alignment beam detector 12d are otherwise generally conventional in the microelectronic resist layer exposure apparatus art. The vertical alignment beam source 12a is intended as an infrared source, generally in a wavelength range from about 800 to about 1200 nanometers. The vertical alignment beam detector 12d is intended as an appropriate detector for detecting radiation from the vertical alignment beam source 12a. Solid state detectors are common, but by no means limit the invention.

FIG. 5 finally shows the reticle 14 that is also illustrated in FIG. 1. The reticle 14 comprises a transparent substrate 14a having located thereupon a patterned opaque material layer 14b. The transparent substrate 14a may comprise any of several transparent materials. Non-limiting examples include glasses, such as but not limited to silicate glasses, as well as quartz materials. The patterned opaque material layer 14b may comprise any of several opaque materials, which are typically metal opaque materials and most commonly chromium metal opaque materials. Typically, the transparent substrate 14a has a conventional thickness, and the patterned opaque material layer 14b also has a conventional thickness.

Figure 6:
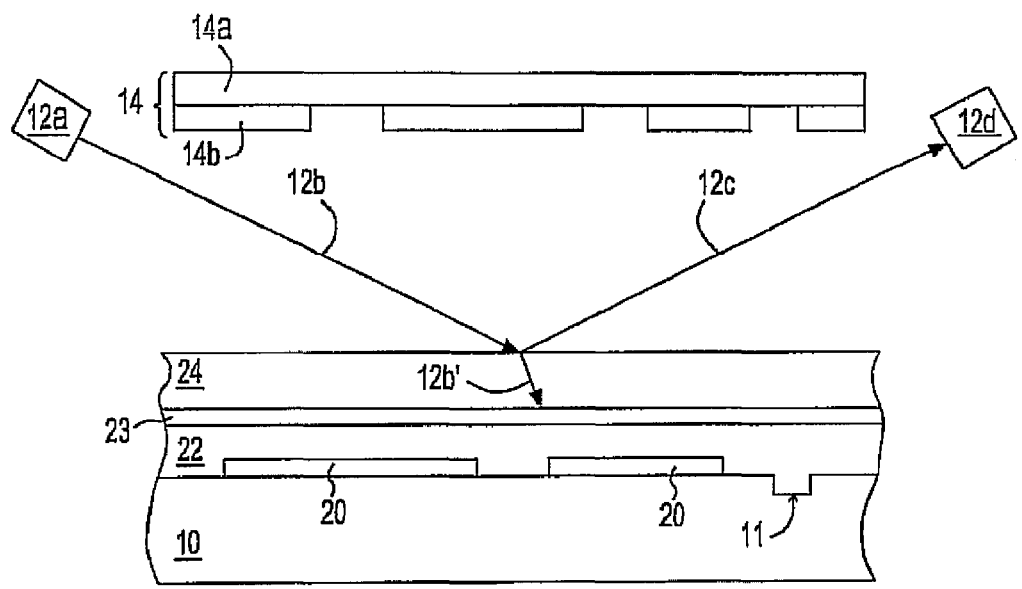

FIG. 6 shows the results of vertically aligning the substrate 10 including in particular the resist layer 24, as is illustrated in FIG. 5, with respect to the reticle 14.

As is illustrated in FIG. 6, the incident vertical alignment beam 12b emanates from the vertical alignment beam source 12a and impinges upon the resist layer 24 where the incident vertical alignment beam 12b is primarily reflected as the reflected vertical alignment beam 12c. In concert with the schematic diagram of FIG. 2, a secondary incident vertical alignment beam 12b' splits from the incident vertical alignment beam 12b at the surface of the resist layer 24. However, due to the presence of the anti-reflective coating layer 23, and thus in contradistinction with the schematic diagram of FIG. 2, the secondary incident vertical alignment beam 12b' does not reach the reflective layer 20, and for that reason there is no secondary reflected vertical alignment beam that correlates with the secondary reflected vertical alignment beam 12c' that is illustrated in FIG. 2. Absent such a secondary reflected vertical alignment beam, the substrate 10 including the resist layer 24, may be more precisely vertically aligned than the substrate 10 that includes the resist layer 24 but absent an anti-reflective coating layer, that is illustrated in FIG. 2.

Figure 7:
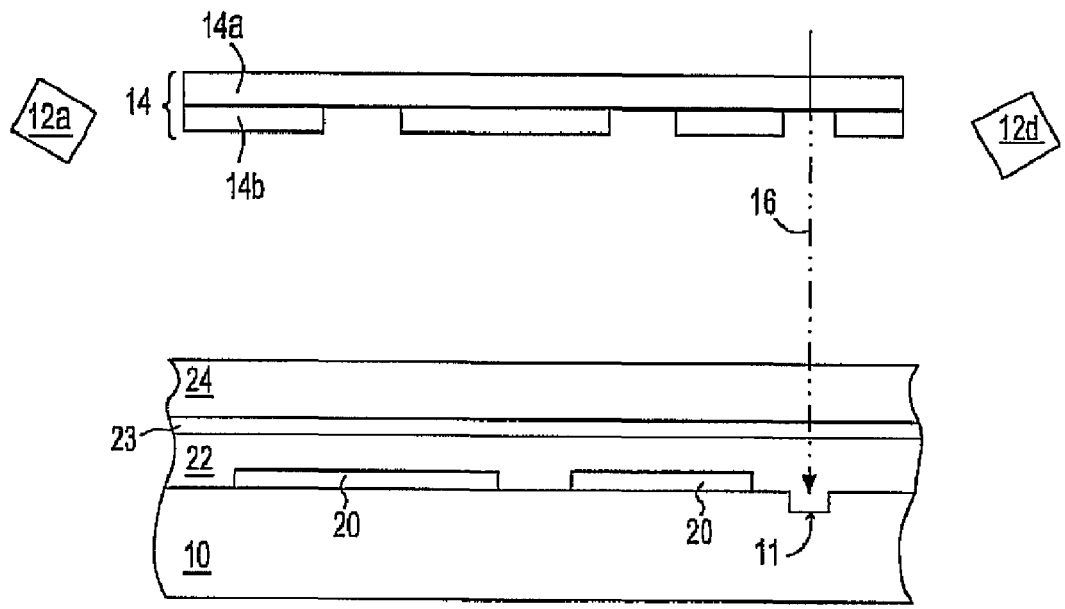

FIG. 7 shows the results of horizontally aligning the substrate 10 with respect to the reticle 14. Such a horizontal alignment uses the horizontal alignment beam 16 for positioning the reticle 14 with respect to the alignment mark 11 within the substrate 10. Such positioning is effected incident to a horizontal movement of at least one of the reticle 14 and the substrate 10 with respect to the other of the reticle 14 and the substrate 10.

Figure 8:
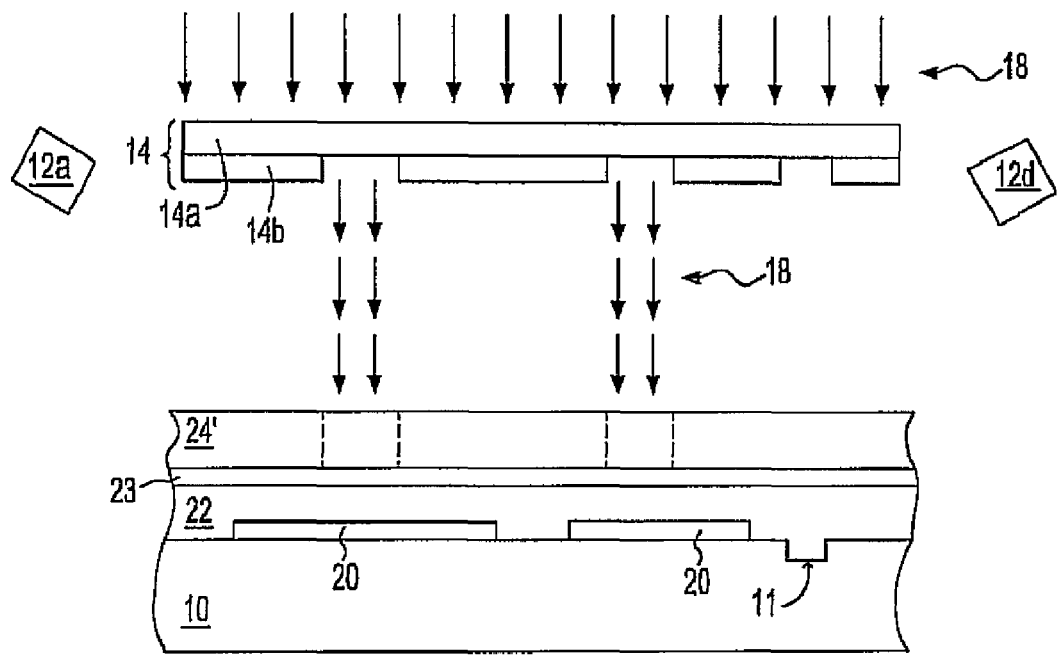

FIG. 8 shows the results of exposing the resist layer 24 with an exposure radiation beam 18 to form an exposed resist layer 24', while using the reticle 14 and exposure optics (that are not otherwise shown) that are properly vertically and horizontally positioned with respect to the resist layer 24 and the substrate 10.

Figure 9:
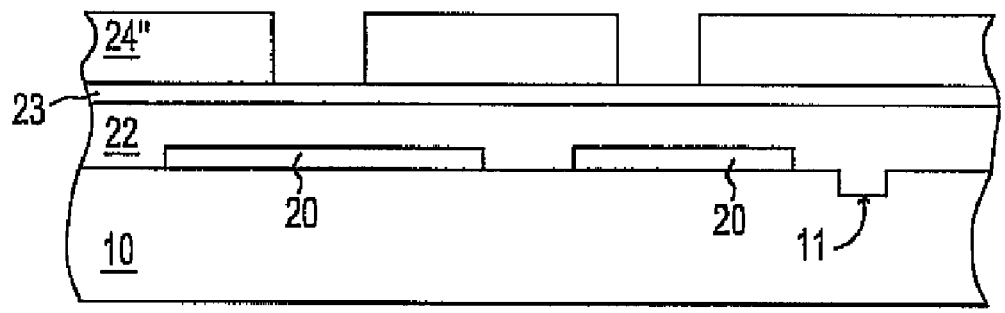

FIG. 9 shows a resist layer 24" that may be developed from the resist layer 24' that is illustrated in FIG. 8. The resist layer 24" that is illustrated in FIG. 9 may be developed from the resist layer 24' that is illustrated in FIG. 8 while using a resist developer that is otherwise generally conventional in the microelectronic fabrication art, and appropriate to the resist material which comprises the resist layer 24'.

Figure 10:
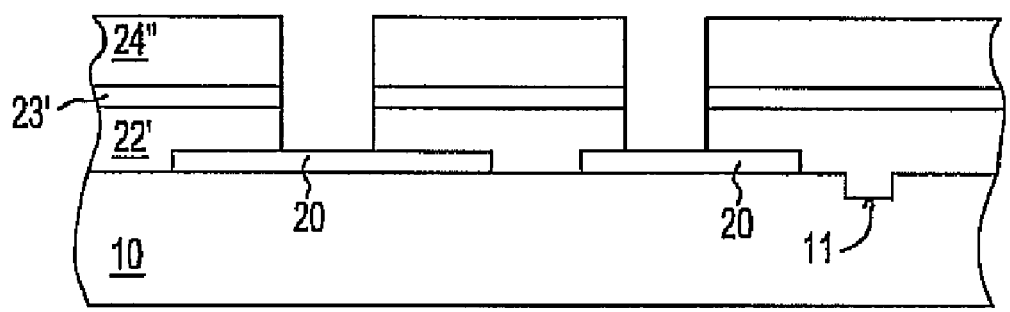

FIG. 10 shows the results of etching the anti-reflective coating layer 23 and the transparent layer 22 to form an anti-reflective coating layer 23' and a transparent layer 22' while using the resist layer 24" as a mask. The foregoing etching is typically effected while using a plasma etch method that provides generally straight sidewalls to the anti-reflective coating layer 23' and the transparent layer 22'. Such a plasma etch method will typically use an etchant gas composition that is appropriate to the materials that comprise the anti-reflective coating layer 23 and the transparent layer 22.

Figure 11:
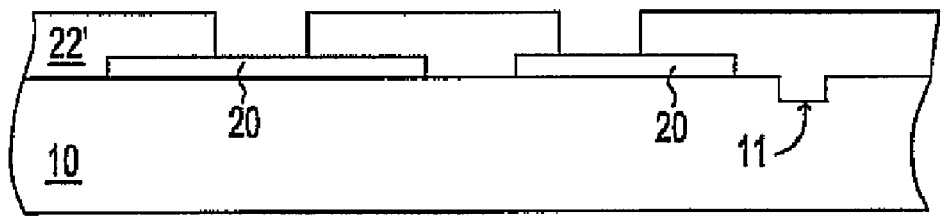

FIG. 11 shows the results of stripping the resist layer 24" and the anti-reflective coating layer 23' from the microelectronic structure of FIG. 10. The resist layer 24" and the anti-reflective coating layer 23' may be stripped using methods and materials that are also generally conventional in the semiconductor fabrication art. Included in general are wet chemical stripping methods and materials, and dry plasma stripping methods and materials, as well as combinations of those methods and materials.

FIG. 11 shows a microelectronic structure fabricated in accordance with a first embodiment of a method of the invention that uses an anti-reflective coating layer that comprises an anti-reflective coating material in accordance with the invention. The microelectronic structure of FIG. 11 includes a transparent layer 22' with enhanced dimensional control. The enhanced dimensional control results from an improved vertical alignment (i.e., focusing) of an exposure apparatus when exposing a resist layer that is used as a mask when etching the transparent layer 22' from a corresponding blanket transparent layer. The improved vertical alignment is understood within the context of a vertical alignment beam, and in particular within the context of attenuation of secondary reflections of the vertical alignment beam from an underlying reflective layer beneath the anti-reflective coating layer which is located beneath the resist layer when vertically aligning and subsequently exposing the resist layer.

FIG. 12 to FIG. 18 show a series of schematic cross-sectional diagrams illustrating the results of progressive stages in aligning a substrate having a resist layer located thereover and exposing the resist layer located over the substrate while using an anti-reflective coating layer comprising an anti-reflective coating material in accordance with another particular embodiment of the invention. This other particular embodiment of the invention comprises a second embodiment of the invention.

Figure 12:
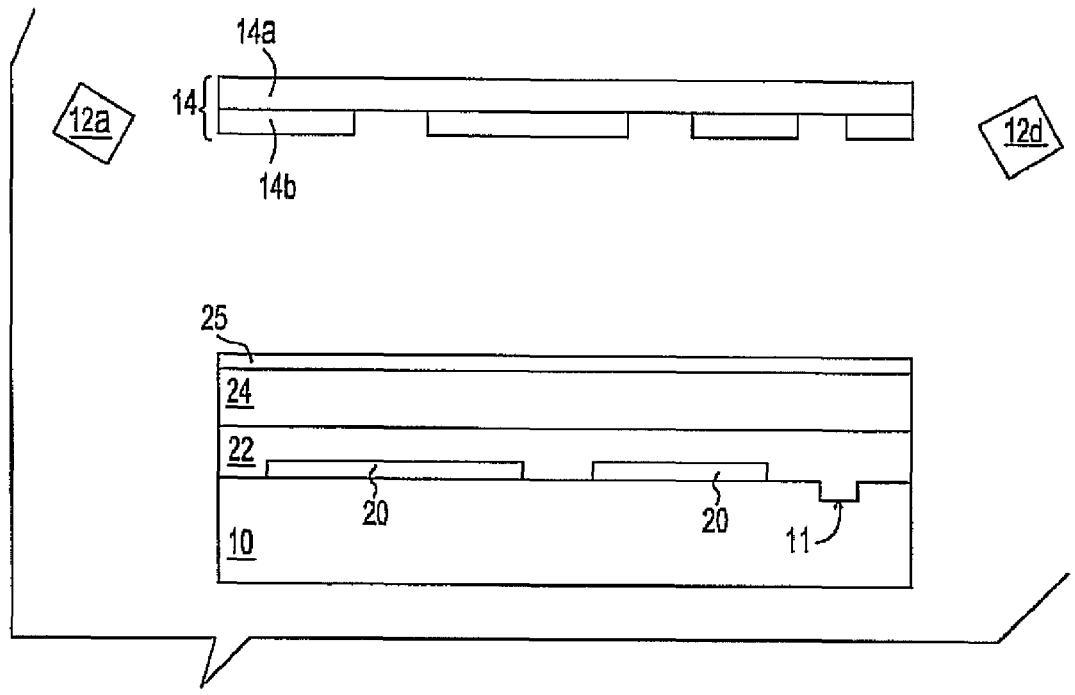
FIG. 12 to FIG. 18 show a series of schematic cross-sectional diagrams illustrating the results of progressive stages in forming a patterned layer within a microelectronic structure while using an anti-reflective coating layer to enhance focus when exposing a resist layer used for forming the patterned layer in accordance with another particular embodiment of the invention.

FIG. 12 shows the substrate 10 including the alignment mark 11. The reflective layer 20 is located upon the substrate 10. The transparent layer 22 is located upon exposed portions of the reflective layer 20 and the substrate 10. A resist layer 24 is located upon the transparent layer 22. An anti-reflective coating layer 25 in accordance with the invention is located upon the resist layer 24. Thus, this second embodiment differs from the first embodiment with respect to a reverse vertical ordering of the resist layer 24 and an anti-reflective coating layer 23 or 25.

Within this second embodiment, the anti-reflective coating layer 25 comprises an anti-reflective material including a composition of matter that exhibits a first absorption peak at an exposure apparatus vertical alignment beam wavelength, as is further discussed above within the context of FIG. 1 to FIG. 4.

Similarly with the first embodiment as illustrated within FIG. 5 to FIG. 11, further processing of the microelectronic structure of FIG. 12 includes: (1) vertically aligning the layered microelectronic substrate 10 within an exposure apparatus while using an exposure apparatus vertical alignment beam and horizontally aligning the layered microelectronic substrate 10 within the exposure apparatus while using an exposure apparatus horizontal alignment beam, to yield an aligned layered substrate 10 and (2) exposing the resist layer 24 within the aligned layered substrate 10 within the exposure apparatus while using an exposure beam that is not specifically illustrated in FIG. 12.

The anti-reflective coating layer 25 within the second embodiment may comprise materials, have dimensions and be formed using methods that are analogous, equivalent or identical to the materials, dimensions and methods used for forming the anti-reflective coating layer 23 that is used within the first embodiment. In particular the anti-reflective coating layer 25 comprises an absorptive material with absorbance characteristics analogous, equivalent or identical to the absorbance characteristics of the anti-reflective coating layer 23 illustrated within the first embodiment.

Figure 13:
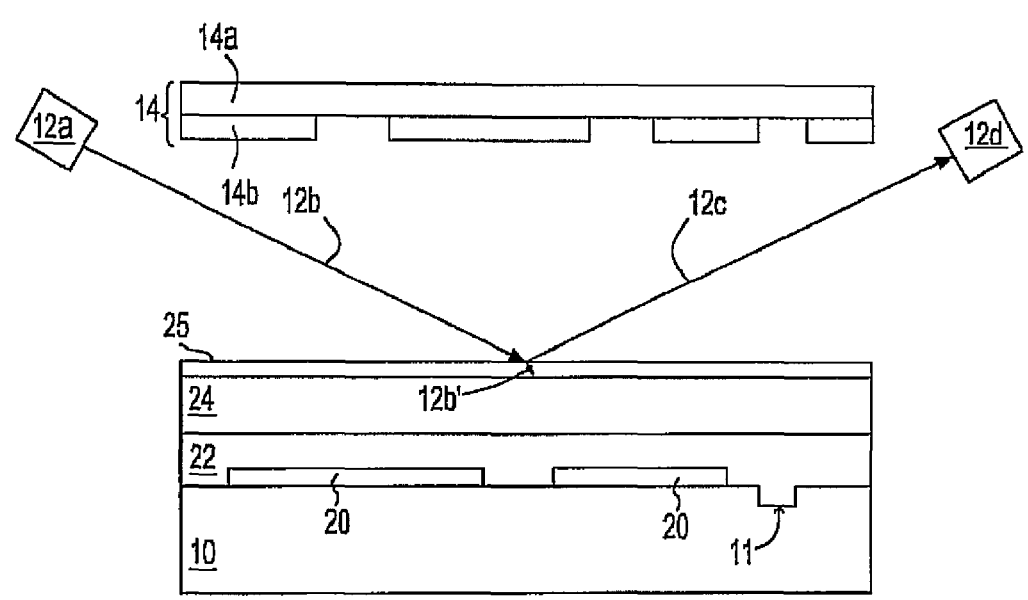

FIG. 13 shows the results of vertically aligning the substrate 10 including in particular the resist layer 24, as is illustrated in FIG. 12, with respect to the reticle 14.

As is illustrated in FIG. 13, and similarly with the schematic diagram of FIG. 2, a secondary incident vertical alignment beam 12b' splits from the incident vertical alignment beam 12b at the surface of the anti-reflective coating layer 25. However, due to the presence of the anti-reflective layer 25, and thus in contradistinction with the schematic diagram of FIG. 2, the secondary incident vertical alignment beam 12b' does not appreciably reach the resist layer 24 or the reflective layer 20, and for this reason there is no secondary reflected vertical alignment beam that correlates with the secondary reflected vertical alignment beam 12c' that is illustrated in FIG. 2. Absent such a secondary reflected vertical alignment beam, the substrate 10, including the resist layer 24, may be more precisely vertically aligned than the substrate 10 that includes the resist layer 24 but absent an anti-reflective coating layer, that is illustrated in FIG. 2.

Figure 14:
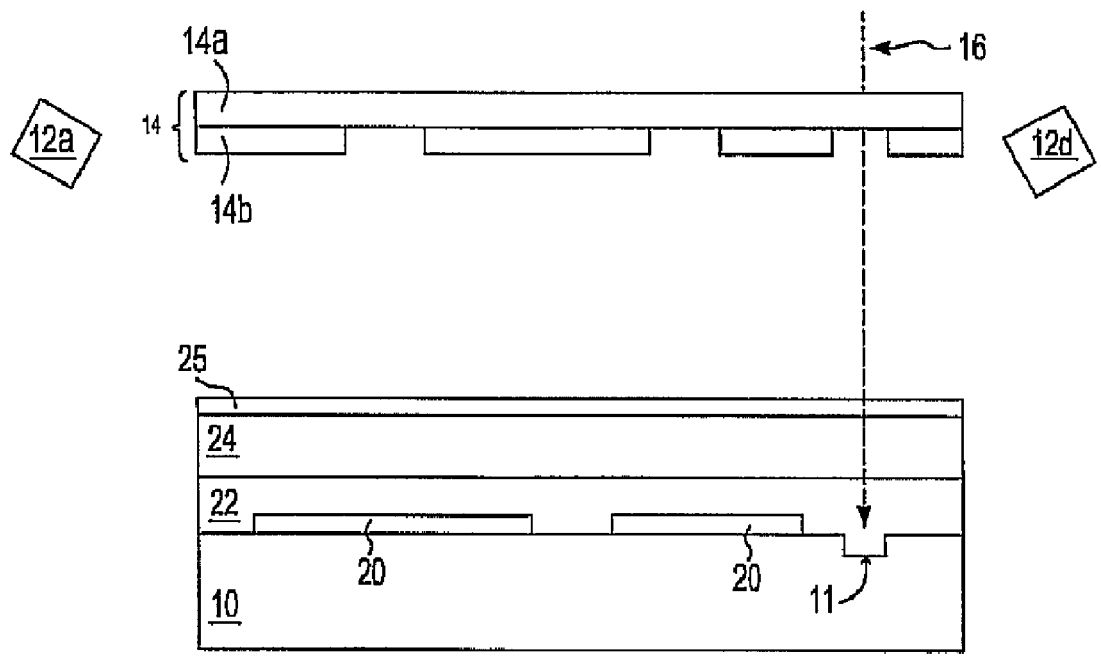

FIG. 14 shows the results of horizontally aligning the substrate 10 with respect to at least the reticle 14 while using the horizontal alignment beam 16. FIG. 14 within this particular second embodiment correlates and corresponds with FIG. 7 within the first embodiment.

Figure 15:
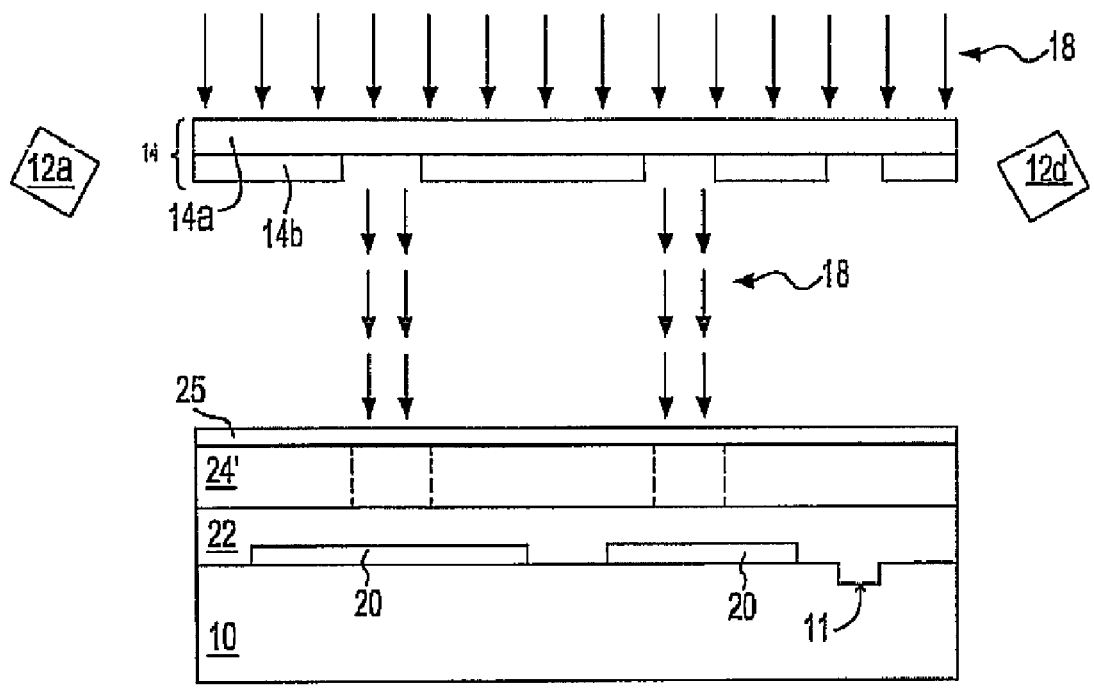

FIG. 15 shows the results of exposing the resist layer 24 with the exposure radiation beam 18 to form an exposed resist layer 24', while using the reticle 14 and exposure optics (that are not otherwise shown) that are properly vertically and horizontally positioned with respect to the resist layer 24 and the substrate 10.

Figure 16:
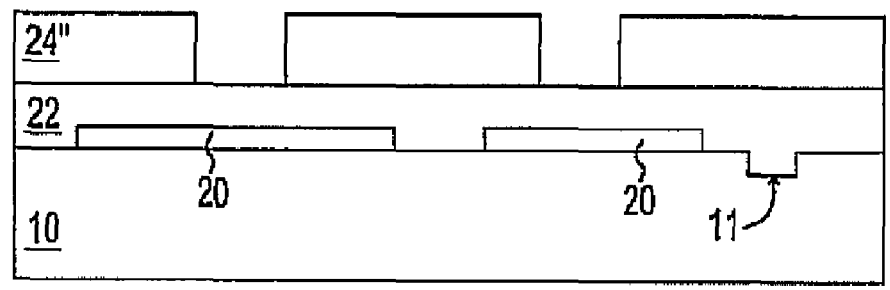

FIG. 16 first shows the results of completely removing the anti-reflective coating layer 25 from the microelectronic structure of FIG. 15. FIG. 16 also shows a resist layer 24" that may be developed from the resist layer 24' that is illustrated in FIG. 15. The anti-reflective layer 25 may be completely removed and stripped from the microelectronic structure of FIG. 15 to provide in-part the microelectronic structure that is illustrated in FIG. 16 while using methods and materials that effectively selectively strip the anti-reflective coating layer 25 while leaving the resist layer 24'. Appropriately selective etchants, such as but not limited to wet chemical etchants, dry plasma etchants and combinations of wet chemical etchants and dry plasma etchants, may be used.

Subsequent to, or simultaneously with, stripping the anti-reflective coating layer 25, the resist layer 24" that is illustrated in FIG. 16 may be developed from the resist layer 24' that is illustrated in FIG. 15 while using a resist developer that is otherwise generally conventional in the microelectronic fabrication art, and appropriate to the resist material which comprises the resist layer 24 or 24'.

Figure 17:
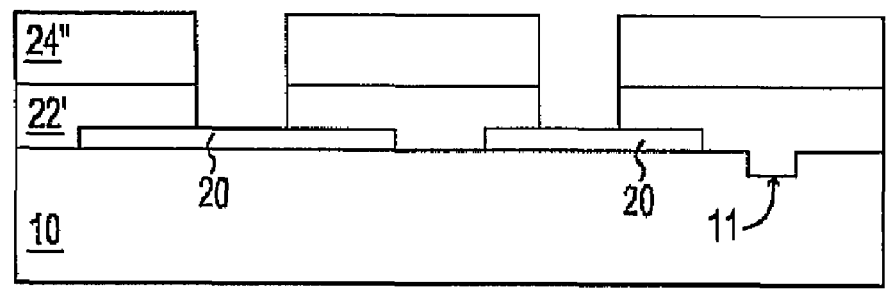

FIG. 17 shows the results of etching the transparent layer 22 to form a transparent layer 22' while using the resist layer 24" as a mask. The foregoing etching is typically effected while using a plasma etch method that provides generally straight sidewalls to the transparent layer 22'. Such a plasma etch method will typically use an etchant gas composition that is appropriate to the material that comprises the transparent layer 22.

Figure 18:
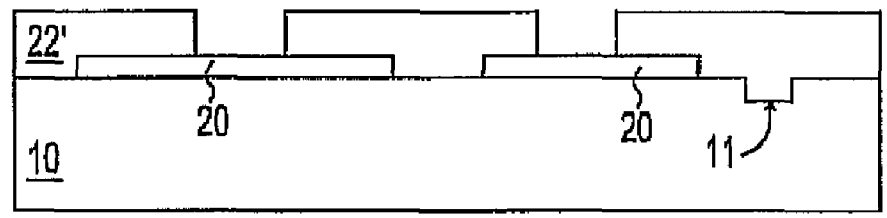

FIG. 18 shows the results of stripping the resist layer 24" from the microelectronic structure of FIG. 17. The resist layer 24" may be stripped using methods and materials that are also generally conventional in the microelectronic fabrication art. Included in general are wet chemical stripping methods and materials, and dry plasma stripping methods and materials.

FIG. 18 shows a microelectronic structure fabricated in accordance with an additional embodiment of a method of the invention that uses an anti-reflective coating layer that comprises an anti-reflective coating material in accordance with the invention. The microelectronic structure of FIG. 18 includes a transparent layer 22' with enhanced dimensional control. The enhanced dimensional control results from an improved vertical alignment (i.e., focusing) of an exposure apparatus when exposing a resist layer that is used as a mask when etching the transparent layer 22' from a corresponding blanket transparent layer. The improved vertical alignment is understood within the context of a vertical alignment beam, and in particular within the context of attenuation of a secondary reflection of the vertical alignment beam from an underlying reflective layer 20 beneath the anti-reflective coating layer which is located above the resist layer which in turn is located above the reflective layer 20, when vertically aligning and subsequently exposing the resist layer.

The preferred embodiments are illustrative of the invention rather than limiting of the invention. Revisions and modifications may be made to methods, materials, structures and dimensions of a microelectronic structure illustrated in accordance with the preferred embodiments, while still providing an anti-reflective coating material, a microelectronic structure that includes an anti-reflective layer that includes the anti reflective coating material and a method for exposing a resist layer and subsequently forming a patterned layer while using the microelectronic structure that includes the anti-reflective coating layer that includes the anti-reflective coating material, while still providing particular materials, structures and methods in accordance with the invention, further in accordance with the accompanying claims.

What is claimed is:

1. A method for exposing a resist layer comprising:
   forming layered over a substrate a target layer, an anti-reflective layer located over the target layer and a resist layer also located over the target layer to form a layered substrate, the anti-reflective coating layer including a composition of matter that exhibits a first absorption peak corresponding with an exposure apparatus vertical alignment beam wavelength;

vertically aligning the layered substrate within an exposure apparatus while using an exposure apparatus vertical alignment beam and horizontally aligning the layered substrate within the exposure apparatus while using an exposure apparatus horizontal alignment beam to yield an aligned layered substrate; and exposing the resist layer within the aligned layered substrate within the exposure apparatus while using an exposure beam.

2. The method of claim 1 further comprising: developing the resist layer to form a patterned resist layer; and treating the target layer while using the patterned resist layer as a mask.

3. The method of claim 1 wherein the first absorption peak is in a range greater than about 800 nanometers.

4. The method of claim 3 wherein: the composition of matter exhibits a second absorption peak corresponding with an exposure wavelength; and the exposure wavelength is less than about 300 nanometers.

5. The method of claim 4 wherein the composition of matter does not exhibit a third absorption peak interposed between the first absorption peak and the second absorption peak.

6. The method of claim 1 wherein the anti-reflective coating layer is interposed between the resist layer and the target layer.

7. The method of claim 1 wherein the resist layer is interposed between the anti-reflective coating layer and the target layer.

8. A method for exposing a resist layer comprising:
positioning within an exposure apparatus a microelectronic structure that includes a reflective layer located over a substrate and a resist layer located over the reflective layer;

vertically aligning the microelectronic structure within the exposure apparatus while attenuating a reflection of a vertical alignment beam from the reflective layer, to provide an aligned substrate; and exposing the aligned substrate within the exposure apparatus.

9. The method of claim 8 wherein the resist layer comprises an infrared absorptive dye.

* * * * *